United States Patent [19]

Balconi-Lamica et al.

[11] Patent Number: 5,516,399
[45] Date of Patent: May 14, 1996

[54] CONTACTLESS REAL-TIME IN-SITU MONITORING OF A CHEMICAL ETCHING

[75] Inventors: Michael J. Balconi-Lamica, Poughquag; Steven G. Barbee, Dover Plains; Tony F. Heinz, Chappaqua, all of N.Y.; Yiping Hsiao, San Jose, Calif.; Leping Li, Poughkeepsie; Eugene H. Ratzlaff, Hopewell Junction, both of N.Y.; Justin Wai-chow Wong, Burlington, Vt.

[73] Assignee: International Business Machines Corporation, Armonk, N.Y.

[21] Appl. No.: 269,863

[22] Filed: Jun. 30, 1994

[51] Int. Cl.⁶ .................................. H01L 21/00
[52] U.S. Cl. ........................ 156/627.1; 156/345
[58] Field of Search ............... 156/626.1, 627.1, 156/657.1, 662.1, 345; 204/129.2

[56] References Cited

U.S. PATENT DOCUMENTS

| | | | |
|---|---|---|---|
| 2,933,675 | 4/1960 | Hoelzle | 324/30 |
| 3,163,568 | 2/1961 | Mieux | 156/627 |
| 3,553,052 | 1/1971 | Jubb, Jr. | 156/345 |
| 3,874,959 | 4/1975 | Hoekstra | 156/7 |
| 3,959,046 | 5/1976 | Bussmann et al. | 156/7 |
| 3,964,956 | 6/1976 | Snyder | 156/345 |
| 4,220,508 | 9/1980 | Kotani et al. | 204/129.65 |
| 4,338,157 | 7/1982 | Kanda | 156/627 |
| 4,497,699 | 2/1985 | de Wit et al. | 204/129.2 |
| 4,621,037 | 11/1986 | Kanda et al. | 430/30 |
| 4,755,442 | 7/1988 | Hasebe et al. | 156/627 |
| 4,793,895 | 12/1988 | Kaanta et al. | 156/627 |
| 4,969,973 | 11/1990 | Rinck et al. | 156/627 |
| 4,989,157 | 1/1991 | Balisky | 204/129.2 X |
| 4,995,939 | 2/1991 | Ferenczi et al. | 156/627 |
| 5,071,508 | 12/1991 | Scheithauer | 156/627 |
| 5,081,421 | 1/1992 | Miller et al. | 324/671 |
| 5,198,072 | 3/1993 | Gabriel et al. | 156/627 |
| 5,338,390 | 8/1994 | Barbee et al. | 156/627 |

FOREIGN PATENT DOCUMENTS

| | | | |
|---|---|---|---|
| 59-52838 | 3/1984 | Japan | 156/627 |
| 59-113626 | 6/1984 | Japan | 156/627 |
| 273634 | 3/1990 | Japan | 156/627 |
| 496346 | 3/1992 | Japan | |
| 8100646 | 3/1981 | WIPO | 156/62 |

OTHER PUBLICATIONS

Goubau, W. M., "Capacitive Etch Rate Monitor for Dielectric Etching", IBM Technical Disc. Bulletin vol. 31, No. 1, Jun. 1988, 448–449.

Liu et al., "Resistance/Capacitance Methods for Determining Oxide Etch End Point", IBM Technical Disc. Bulletin vol. 16, No. 8, Jan. 1974, 2706–2707.

Hoekstra, J. P., "Establishing End Point During Delineation Process", IBM Technical Disc. Bulletin vol. 16, No. 6, Nov. 1973, 1717–1720.

Bassous et al., "An In–Situ Etch Rate Monitor Controller", IBM Technical Disc. Bulletin vol. 20, No. 3, Aug. 1977, 1232–1234.

*Primary Examiner*—William Powell
*Attorney, Agent, or Firm*—Dale M. Crockatt

[57] ABSTRACT

A contactless method and apparatus for real-time in-situ monitoring of a chemical etching process for the etching of at least one wafer in a wet chemical etchant bath are disclosed. The method comprises the steps of providing at least two conductive electrodes in the wet chemical bath, wherein the at least two electrodes are proximate to but not in contact with the at least one wafer, and further wherein said two electrodes are positioned on the same side of the wafer; and monitoring an electrical characteristic between the at least two electrodes, wherein a prescribed change in the electrical characteristic is indicative of a prescribed condition of the etching process. Such a method and apparatus are particularly useful in a wet chemical etch station.

18 Claims, 2 Drawing Sheets

CONTACTLESS REAL-TIME IN-SITU MONITORING OF A CHEMICAL ETCHING

BACKGROUND OF THE INVENTION

1. Field of the Invention

The present invention generally relates to a method and apparatus for monitoring the etching condition of a chemical etching process, and more particularly, to an improved contactless real-time in-situ method and apparatus for the same.

2. Discussion of the Related Art

Etching rates and etch end points must be carefully monitored and controlled in order to end etching processes at the desired time. In semiconductor processing, inadequate or excess etching time can result in undesirable film patterning. For instance, for semiconductor devices having film layers or features in the micron and sub-micron range, an inadequate etch or an excess etch would result in the insufficient removal or the excess removal of a desired layer. Insufficient removal of a desired layer can result in an undesired electrical open or electrical short when the desired layer to be removed is an insulator or a conductor, respectively. Additionally, if the etch is in excess, undercutting or punch through can occur resulting in poorly defined film patterning or total lift-off. Inadequate or excess etching time further leads to undesirable reliability problems in the subsequently fabricated semiconductor device. As a semiconductor wafer is extremely expensive due to many processing steps involved in the making thereof, the need to critically control the etching end point in an etching process is highly desirable.

An etch end point must be accurately predicted and/or detected to terminate etching abruptly. Etch rates, etch times, and etch end points are difficult to consistently predict due to lot-to-lot variations in film thickness and constitution, as well as etch bath temperature, flow, and concentration variability. That is, an etch rate is dependent upon a number of factors, which include, etchant concentration, etchant temperature, film thickness, and the film characteristics. Precise control of any of these factors can be very expensive to implement, for example, concentration control.

Currently, most etch rate end point determination techniques depend on indirect measurement and estimation techniques. Some etch monitoring techniques have relied on external measurements of film thickness followed by etch rate estimation and an extrapolated etch end point prediction. However, etch rates may vary due to batch-to-batch differences in the chemical and physical characteristics of the film or the etchant. These extrapolation methods are inadequate.

Real-time, in-situ monitoring is preferred. Some in-situ techniques monitor the etch rate of a reference thin film. This may require additional preparation of a monitor wafer containing the reference thin film or a suitable reference may be unavailable. Still other techniques require physical contact of electrical leads with the wafer being etched and electrical isolation of those leads and associated areas of the wafer from the etchant. This presents problems associated with contamination, contact reliability and reproducibility, and the physical constraints which affect ease of use in manufacturing or automation. Yet other in-situ techniques monitor the etch rate of a fiducial region of the workpiece wafer and require optical access to the wafer in the wet etch bath. Such methods are expensive as portions of the wafer are occupied by non-product fiducial areas. Such optical methods are also subject to uncertainty resulting from turbidity of the etch bath and other optical effects and uncertainty resulting from non uniform films.

It would thus be desirable to provide a method and apparatus which provides non-contact, real-time, in-situ monitoring of an etching condition of a wafer being etched.

In copending U.S. patent application Ser. No. 07/985,413, filed Dec. 4, 1992, entitled "Contactless Real-Time In-Situ Monitoring of a Chemical Etching Process," assigned to the assignee of the present invention (attorney docket FI9-92-152), we disclose a method and apparatus for the contactless, real-time, in-situ monitoring of a chemical etching process during etching of a wafer in a wet chemical etchant bath, wherein the two conductive electrodes are proximate to but not in contact with the at least one wafer, and further wherein said two electrodes are positioned on opposite sides of the wafer.

However, in some circumstances the placement of electrodes on either side of a single wafer or batch of wafers is difficult or disadvantageous because of the limited access afforded. Wafer carriers and robotics limit where and how electrodes are placed. Attempting to place electrodes between or too close to wafers might risk scratching a wafer.

Furthermore, in some circumstances mechanical disturbances such as turbulent etchant flow or vibrations can cause a wafer to move during the etch monitoring period. Such wafer movement, whether random or regular, can complicate, or render less precise, the end point monitoring detection method.

It would thus be desirable to provide an improved method and apparatus which provides non-contact, real-time, in-situ monitoring of an etching condition of a wafer being etched.

SUMMARY OF THE INVENTION

An object of the present invention is to overcome the problems in the art discussed above.

Another object of the present invention is to provide an improved non-contact method of monitoring the etching condition of a wafer being etched.

Yet another object of the present invention is to provide an accurate real-time, in-situ method and apparatus for monitoring an etching condition of a wafer being etched.

Yet another object of the present invention is to provide an accurate real-time, in-situ method and apparatus for controlling a wafer etching process.

According to the present invention, a contactless method for real-time in-situ monitoring of a chemical etching process for the etching of at least one wafer in a wet chemical etchant bath comprises the steps of:

a) providing two conductive electrodes in the wet chemical bath, wherein said two electrodes are proximate to but not in contact with the at least one wafer, and further wherein said two electrodes are positioned on the same side of the wafer; and b) monitoring an electrical characteristic between the two electrodes, wherein a prescribed change in the electrical characteristic is indicative of a prescribed condition of the etching process.

In addition, according to the present invention, a contactless real-time in-situ chemical etch monitor for providing an indication of a prescribed condition of an etching process of at least one wafer to be etched in a wet chemical etchant bath comprises the elements of:

a) two conductive electrodes;

b) a means for positioning said two conductive electrodes inside the wet chemical etchant bath proximate to but not in contact with the at least one wafer, wherein said two electrodes are positioned on the same side of the wafer; and c) a means for monitoring an electrical characteristic between the two electrodes, wherein a prescribed change in the electrical characteristic is indicative of a prescribed condition of the etching process.

BRIEF DESCRIPTION OF THE DRAWINGS

The foregoing and other teachings and advantages of the present invention will become more apparent upon a detailed description of the best mode for carrying out the invention as rendered below. In the description to follow, reference will be made to the accompanying drawings, in which.

DETAILED DESCRIPTION OF THE PREFERRED EMBODIMENTS

Copending U.S. patent application Ser. No. 07/985,413, filed Dec. 4, 1992, now U.S. Pat. No. 5,338,390, entitled "Contactless Real-Time In-Situ Monitoring of a Chemical Etching Process," assigned to the assignee of the present invention (attorney docket FI9-92-152), the disclosure of which is hereby incorporated by reference into the present application, describes a related method and apparatus for the contactless, real-time, in-situ monitoring of a chemical etching process during etching of a wafer in a wet chemical etchant bath, wherein the two conductive electrodes are proximate to but not in contact with the at least one wafer, and further wherein said two electrodes are positioned on opposite sides of the wafer. Six copending U.S. Patent Applications, filed on even date herewith, which are Ser. No. 08/269,864, entitled "MINIMIZING OVERETCH DURING A CHEMICAL ETCHING PROCESS;" Ser. No. 08/269,862, entitled "REAL TIME MEASUREMENT OF ETCH RATE DURING A CHEMICAL ETCHING PROCESS;" Ser. No. 08/269,861, entitled "MEASURING FILM ETCHING DURING A CHEMICAL ETCHING PROCESS;" Ser. No. 08/269,860, U.S. Pat. No. 5,480,511, entitled "METHOD AND APPARATUS FOR CONTACTLESS REAL-TIME IN-SITU MONITORING OF A CHEMICAL ETCHING PROCESS;" Ser. No. 08/269,859, U.S. Pat. No. 5,451,289, entitled "FIXTURE FOR IN-SITU NON-CONTACT MONITORING OF WET CHEMICAL ETCHING WITH PASSIVE WAFER RESTRAINT;" and Ser. No. 08/269,865, U.S. Pat. No. 5,445,705, "METHOD AND APPARATUS FOR CONTACTLESS REAL-TIME IN-SITU MONITORING OF A CHEMICAL ETCHING PROCESS;" and which are assigned to the assignee of the present invention, describe improvements to the method and apparatus for contactless, real-time, in-situ monitoring of chemical etching disclosed in the 07/985,413 application. The disclosure of the aforesaid six copending applications is also hereby incorporated by reference into the present application.

Figure 1:
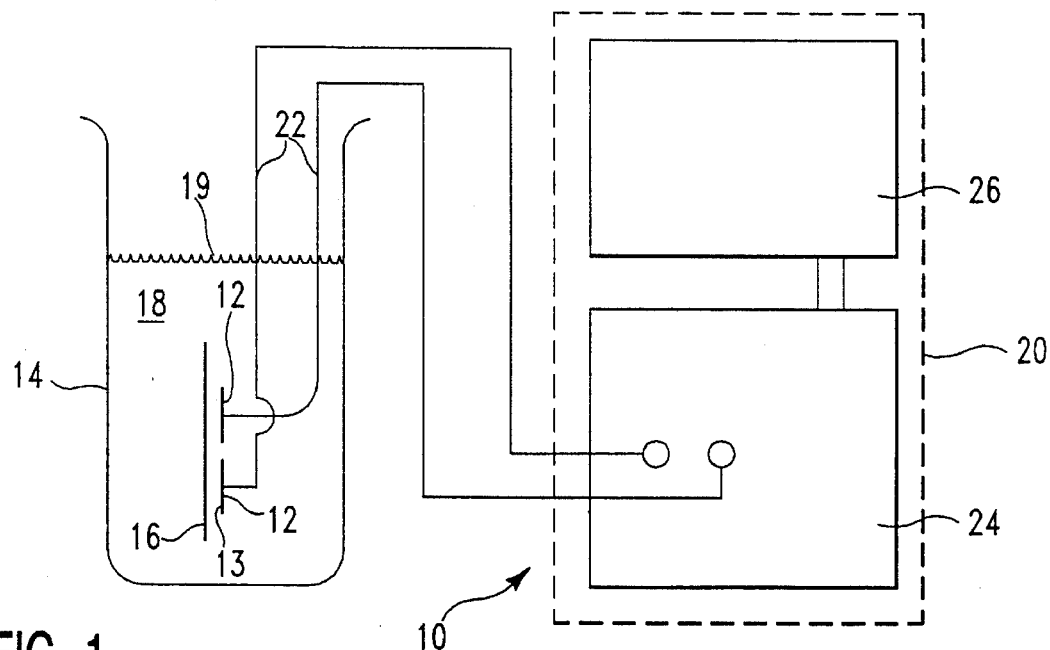
FIG. 1 shows a contactless real-time in-situ etching condition monitor according to the present invention.

Referring now to FIG. 1, there is shown an improved contactless, real-time, in-situ monitor 10 for providing an indication of a prescribed condition in an etching process according to the present invention. Monitor 10 comprises at least two conductive electrodes 12 positionable inside an etchant tank 14. Etchant tank 14 is of an appropriate size for receiving at least one wafer 16 to be etched. The at least one wafer 16 comprises a semiconductor wafer having at least one film layer thereon which is desired to be removed by a chemical etchant bath 18. The at least one wafer 16 is positioned in any suitable standard wafer carrier (not shown) and submerged in the chemical etchant bath 18, wherein the chemical etchant bath comprises a suitable etchant for removing the desired film layer on the at least one wafer 16. While only one wafer is shown, more than one wafer may be placed in the etchant bath 18.

Electrodes 12 can comprise, for example, flat plates, having dimensions of approximately 1 inch square and 0.01 inches thick. Electrodes 12 further comprise a conductive material which is insensitive to the etchant bath 18 and non-contaminating, such as, platinum. Electrodes 12 are positionable within the etchant bath 18 by any suitable means such that the faces 13 of electrodes 12 are oriented perpendicular to the liquid surface 19 of bath 18 and further wherein electrodes 12 are substantially parallel to each other. As shown in FIG. 1, the electrodes 12 are positioned on the same side of the at least one wafer 16. Furthermore, electrodes 12 are spaced away from the at least one wafer 16 by a prescribed distance, for example, one-quarter of an inch. The prescribed distance is established such that the electrodes 12 are remote from and not in direct contact with the at least one wafer 16, thus eliminating any need for special physical contacting electrodes, while permitting suitable etchant access and flow. The remote and non-contact electrodes 12 further preclude any physical damage to the at least one wafer 16.

Electrodes 12 are connected to an electrical characteristic monitoring device 20 by electrical wires 22. Electrical wires 22 can comprise, for example, 0.020 inch diameter 60/40 platinum/rhodium wire and further be sheathed with an insulating material (not shown). The wires 22 can be rigidly clamped above the etchant bath 18 to the side of the tank 14 and are directed vertically down into the etchant bath 18 along the side of tank 14 until reaching the approximate vertical center of the solution or etchant bath 18. Immersed in the etchant bath 18, wires 22 contain an approximate bend of 90 degrees and are directed toward the horizontal center of the solution (and each other). Furthermore, wires 22 terminate at the electrodes 12, thereby securing the electrodes 12.

Electrical characteristic monitoring device 20 can comprise, for example, an impedance analyzer 24 and a data recording and displaying device 26, such as any commercially available chart recorder. It should be noted that electrical characteristic monitoring device 20 can likewise comprise an impedance analyzer and a computer or a programmable controller, the computer or programmable controller providing feedback control to initiate, control, and terminate an etching operation. Impedance analyzers, computers, and programmable controllers are well known in the art.

In operation, the present invention provides a real-time method and apparatus for monitoring a prescribed etching characteristic, such as, etch rate or etch end point of an etching process. Etch end point is used herein to refer to the point in time when a desired film layer or portion thereof is completely removed. Monitoring of the prescribed etching characteristic is effected by electrically sensing, in-situ, changes in an electrical characteristic of the wafer, such as, the impedance or an element or elements of impedance (e.g., admittance, capacitance, inductance, reactance and/or resistance), between the two electrodes 12. For example, the real and imaginary parts of the impedance as a function of time may be measured. The electrodes 12 are positioned proximate to but not in contact with the etched wafer 16. During the removal of a conducting or dielectric film from the etched wafer 16, the impedance of the etched wafer 16 and its environment changes. The changes of impedance with time are related to etching rates. Changes in the rate of change in the impedance element(s), specifically slope reversals and trend discontinuities, are related to changes in phase transitions where a change in the etchant-wafer interface has occurred. These impedance transitions mark distinct etching characteristics, such as, etch end points. Thus etching rates and etching end points can be readily determined in real-time.

The contactless real-time, in-situ chemical etching method and apparatus of the present invention operate by first placing the wafer 16 to be etched into the etchant bath 18. Wafer 16 is proximate to but not touching electrodes 12, thus avoiding an unnecessary and potentially damaging contact between the wafer 16 and electrodes 12. Electrodes 12 are used for measuring an impedance such that wafer 16 is subject to an electric field developed between the electrodes 12. The impedance of the electrodes 12 and their environment is measured in a standard way for measuring impedance, such as by applying AC current or voltage (either continuous or pulsed) to the electrodes and monitoring the passed current or developed potential. Electrical characteristic monitoring means 20 provides a means for monitoring the passed current or developed potential in an appropriate way. As previously discussed, electrical characteristic monitoring means 20 can comprise, for example, any commercially available impedance analyzer or conductivity bridge.

Described in another way, the present invention provides for the in-situ monitoring of dimensional changes of the wafer in the liquid etchant. Dimensional changes, such as film thinning, are monitored by sensing resultant changes in the electrical characteristics of the wafer and the etchant environment. The at least two electrodes 12 are proximate to but not in direct physical contact with the at least one wafer 16. The electrodes 12 and wafer 16 are in ohmic or capacitive contact with the etchant solution 18. Electrical characteristic monitoring means 20 provides a means of monitoring changes in impedance or changes in an appropriate element of the impedance between the electrodes.

EXAMPLE

Operation of the present invention will now be further described using an example. The present invention has been applied to monitoring the etching of aluminum oxide ($Al_2O_3$) films using an aqueous phosphoric acid etchant. The present invention provided sufficient information to accurately identify an etch end point, that is, where the etchant had removed the oxide layer.

Etching was performed using an etchant bath 18 comprising 1.2 liters of 85% (w/w) $H_3PO_4$ dissolved in 32 liters of deionized water, maintained at 75° C., and contained in quartz tank 14. The bath 18 was stirred via a conventional teflon-coated magnetic stirring bar about 1 inch long, rotating at about 4 Hz.

A wafer 16 comprising a silicon wafer of approximately 0.1 ohm cm resistivity, 3 inch diameter, backside rough, having an $Al_2O_3$ film approximately 5000 Å thick thereon, was etched in the etchant bath 18. Electrodes 12 comprise 2.5" by 1" by 0.010" thick platinum rectangles rigidly positioned with respect to the wafer surface by a Teflon fixture (not shown). Wafer 16 was situated vertically in tank 14, with the wafer face perpendicular to the surface 19 of the etchant bath 18, and the electrodes 12 positioned adjacent to one side of wafer 16. The wafer was fully immersed and rigidly fixed in position with the wafer-to-electrode spacing being held constant by a Teflon wedge during the etching process.

Figure 2:
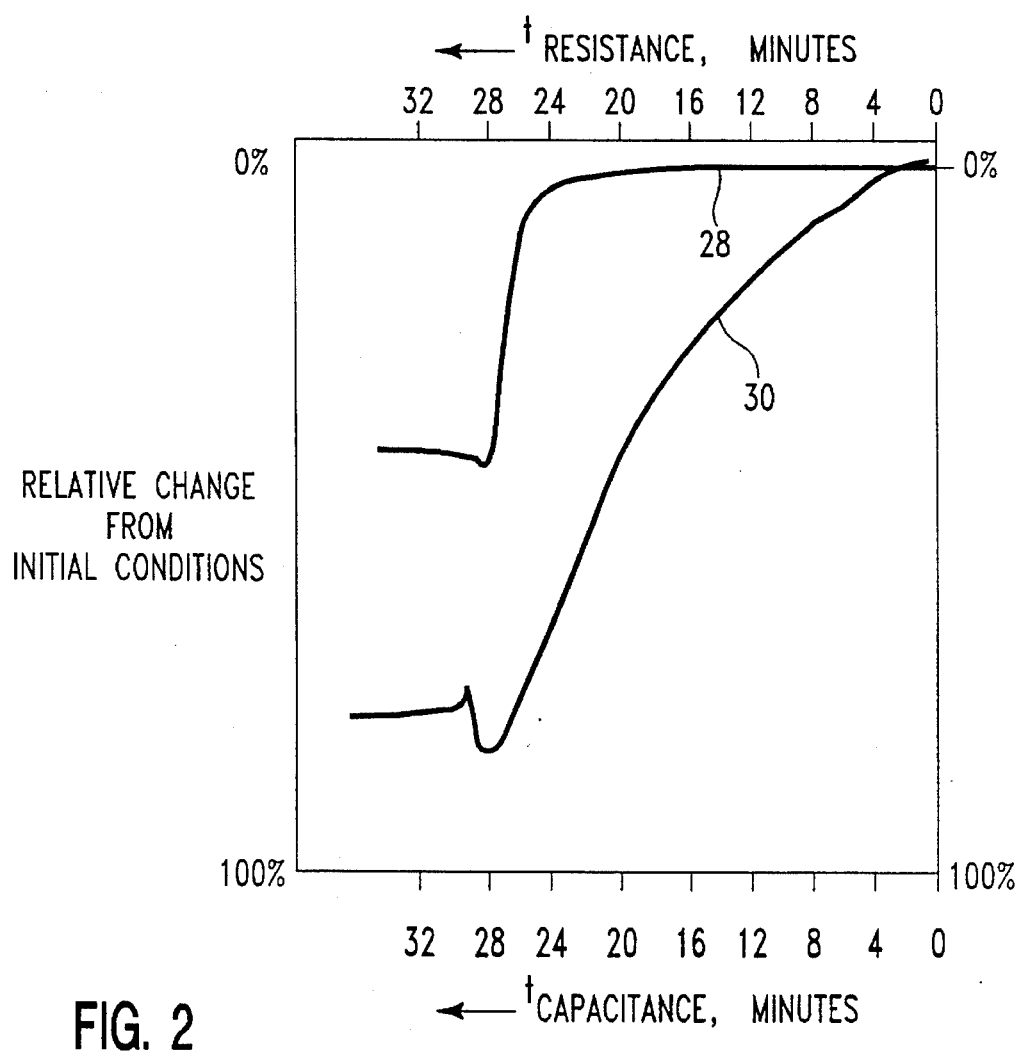
FIG. 2 shows a graph of monitored electrical characteristics according to the present invention; and, FIG. 3 shows an etch station incorporating the contactless real-time in-situ etching condition monitor according to the present invention.

Upon the submersion of the wafer 16 into the bath 18, electrical characteristics comprising resistance and capacitance were monitored simultaneously in real-time using impedance analyzer 24. Many parameters, such as the applied frequency, the specific electrode design, and the relative orientation of the patterned wafer to the electrodes, may be adjusted for optimal signal detection, but are not critical to the operation of the invention. Changes in resistance and capacitance with time were recorded by chart recorder 26 and are shown in FIG. 2. by curves 28 and 30, respectively. The etch was complete in approximately 30 minutes.

Alternatively, this technique might be used to provide proportional control wherein the invention is used to monitor the extent of etch in order to stop etching before the endpoint is reached. This application restricts the method to a situation in which only the film thickness varies, but other conditions (film properties, etchant temperature and concentration) remain the same. This would be useful in the case where a film is to be thinned only, and not completely removed.

In a preferred embodiment, the apparatus may further comprise a means for rigidly positioning one or more wafers inside the wet chemical etchant bath a prescribed distance from the two electrodes. This is advantageous in reducing uncontrolled wafer motion from mechanical disturbances which may perturb the electrical characteristic being monitored. For example, the wafer-to-electrode spacing may be fixed by means of a Teflon wedge or slot in a holder which rigidly holds the one or more wafers during the etching process in a particular position with respect to the electrodes. It will be apparent that there may be many variations in the wafer holding fixture which are capable of rigidly fixing the one or more wafers.

Furthermore, the wafer holding means may be adjustable to a plurality of prescribed distances between the wafer and the two electrodes. Without limiting the scope of the invention, such adjustable holding means may be passively adjustable, that is, slidingly, rotationally, or otherwise adjusted to result in the one or more wafers being placed in a prescribed position when etching is commenced. Such adjustable holding means may alternatively or independently be actively adjustable, that is the holding fixture may vary the position of the wafer in a controlled manner during the etching process, such as in response to feedback from the monitoring means, or to optimize the attributes of the electrical characteristic being monitored.

Figure 3:
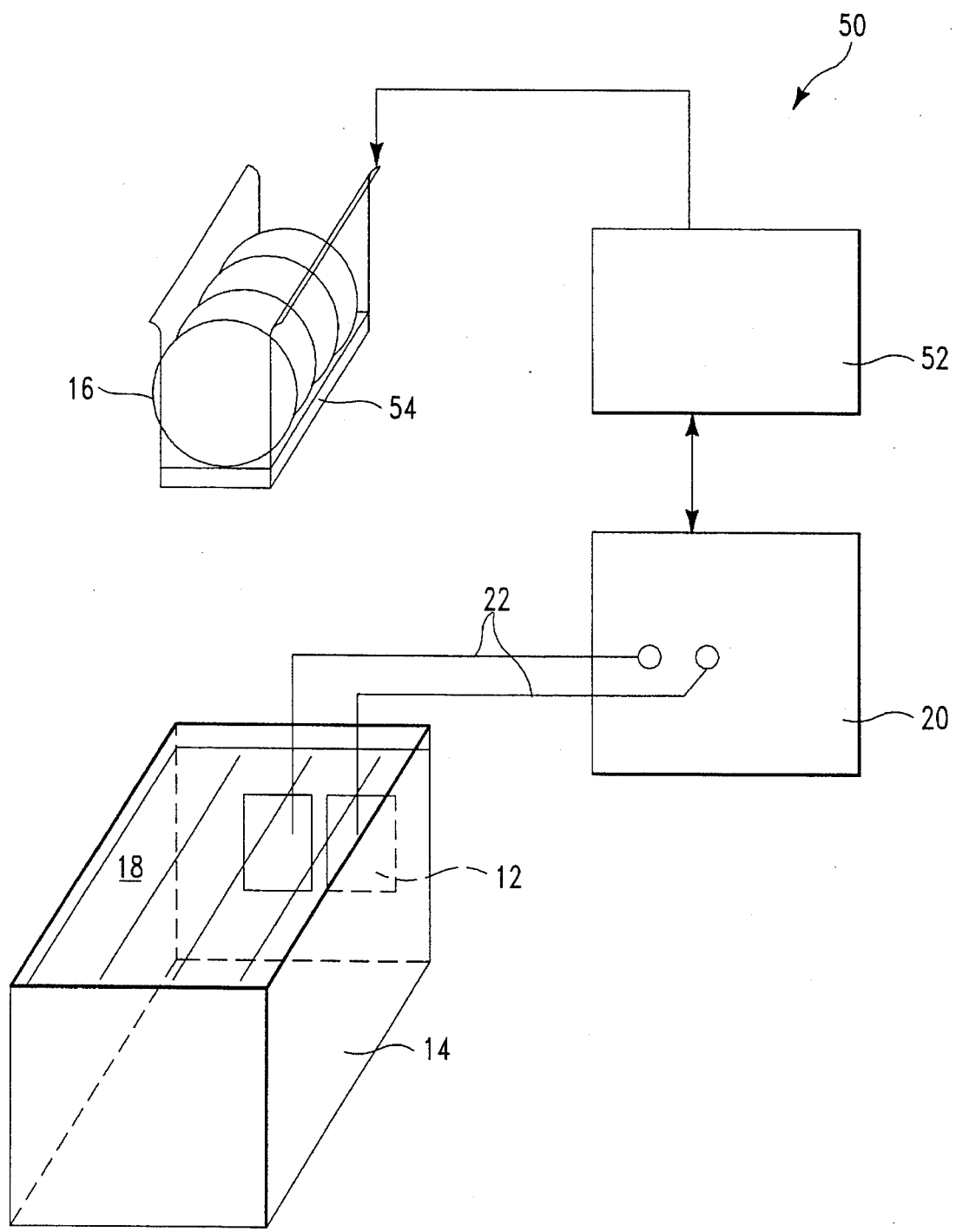

Referring now to FIG. 3, in an alternate embodiment of the present invention, an etch station 50 incorporating the contactless real-time in-situ monitor of the present invention includes a control means 52 which is responsive to electrical characteristic monitoring means 20. Control means 52 can comprise, for example, a computer or programmable controller in conjunction with any suitable mechanism (not shown) for raising and lowering the wafer carrier 54 into and out of the bath 18. Means 52 controls the placement of the wafer carrier 54 into and out of the etchant bath 18 in response to the sensing of a prescribed etching condition or conditions by the electrical characteristic monitoring means 20. Thus, etch station 50 provides accurate and highly efficient etching control.

Thus there has been shown a real-time in-situ monitoring method and apparatus which provide accurate, non-contact, monitoring of an etching characteristic of an etching process. Such a method and apparatus are inexpensive to implement and ensure the integrity of the etched wafer or wafers. Etching of a wafer can be controlled precisely.

While the invention has been particularly shown and described with reference to specific embodiments thereof, it will be understood by those skilled in the art that various changes in form and detail may be made thereto, and that other embodiments of the present invention beyond embodiments specifically described herein may be made or practiced without departing from the spirit of the invention. For example, while the invention has been described with respect to the detection of an etching end point of a wafer having a aluminum oxide film layer thereon, other wafers (e.g., blanket or patterned) may be used. System condition parameters, such as impedance analyzer frequency, etc., may need to be adjusted accordingly to obtain optimum detection sensitivity. Similarly, other changes, combinations and modifications of the presently disclosed embodiments will also become apparent. The embodiments disclosed and the details thereof are intended to teach the practice of the invention and are intended to be illustrative and not limiting. Accordingly, such apparent but undisclosed embodiments, changes, combinations, and modifications are considered to be within the spirit and scope of the present invention as limited solely by the appended claims.

What is claimed is:

1. A contactless method for real-time in-situ monitoring of a chemical etching process during etching of at least one wafer in a wet chemical etchant bath, said method comprising the steps of:
   a) providing two conductive electrodes in the wet chemical bath, wherein said two electrodes are proximate to but not in contact with the at least one wafer, and further wherein said two electrodes are positioned on the same side of the wafer; and
   b) monitoring an electrical characteristic between the two electrodes, wherein a change in the electrical characteristic is indicative of a state of the etching process.

2. The method of claim 1, wherein the monitoring of an electrical characteristic in step (b) comprises monitoring impedance and further wherein the change in the electrical characteristic comprises a change in impedance.

3. The method of claim 2, wherein the monitoring of an electrical characteristic in step (b) comprises monitoring impedance and further wherein the change in the electrical characteristic comprises a change in a component of impedance, wherein said component is selected from the group consisting of admittance, reactance, resistance, capacitance, and inductance.

4. The method of claim 1, wherein the state in step (b) comprises an etching end point.

5. The method of claim 1, further comprising the step of controlling the etching process in response to the monitoring of the change in the electrical characteristic.

6. A contactless real-time in-situ chemical etch monitor for providing an indication of a state of an etching process during etching of at least one wafer in a wet chemical etchant bath, said monitor comprising:
   a) two conductive electrodes;
   b) a means for positioning said two conductive electrodes inside the wet chemical etchant bath proximate to but not in contact with the at least one wafer, wherein said two electrodes are positioned on the same side of the wafer; and
   c) a means for monitoring an electrical characteristic between the two electrodes, wherein a change in the electrical characteristic is indicative of a state of the etching process.

7. The monitor of claim 6, wherein the monitoring means comprises an impedance monitor and further wherein the change in the electrical characteristic comprises a change in impedance.

8. The monitor of claim 7, wherein the monitoring means comprises an impedance monitor and further wherein the change in the electrical characteristic comprises a change in a component of impedance, wherein said component is selected from the group consisting of admittance, reactance, resistance, capacitance, and inductance.

9. The monitor of claim 6, wherein the state in means (c) comprises an etching end point.

10. The monitor of claim 6, further comprising a means of controlling the etching process in response to the monitoring of the change in the electrical characteristic.

11. The monitor of claim 6, further comprising a means for rigidly positioning said at least one wafer inside the wet chemical etchant bath a fixed distance from the two electrodes.

12. The monitor of claim 11, wherein said means for rigidly positioning said at least one wafer is adjustable to a plurality of distances between the wafer and the two electrodes.

13. An etch station having contactless real-time in-situ control of an etching process during etching of at least one wafer in a wet chemical etchant bath, said etch station comprising:
   a) two conductive electrodes;
   b) a means for positioning said two conductive electrodes inside the wet chemical etchant bath proximate to but not in contact with the at least one wafer, wherein said two electrodes are positioned on the same side of the wafer;
   c) a means for monitoring an electrical characteristic between the two electrodes, wherein a change in the electrical characteristic is indicative of a state of the etching process; and
   d) a means for controlling the etching process in response to the monitoring of the change in the electrical characteristic.

14. The etch station of claim 13, wherein the monitoring means comprises an impedance monitor and further wherein the change in the electrical characteristic comprises a change in impedance.

15. The etch station of claim 14, wherein the monitoring means comprises an impedance monitor and further wherein the change in the electrical characteristic comprises a change in a component of impedance, wherein said component is selected from the group consisting of admittance, reactance, resistance, capacitance, and inductance.

16. The etch station of claim 13, wherein the state in means (c) comprises an etching end point.

17. The etch station of claim 13, further comprising a means for rigidly positioning said at least one wafer inside the wet chemical etchant bath a fixed distance from the two electrodes.

18. The etch station of claim 17, wherein said means for rigidly positioning said at least one wafer is adjustable to a plurality of distances between the wafer and the two electrodes.

* * * * *